United States Patent [19]

Chen et al.

[11] Patent Number: 4,481,527

[45] Date of Patent: Nov. 6, 1984

[54] HIGH DENSITY MNOS TRANSISTOR WITH ION IMPLANT INTO NITRIDE LAYER ADJACENT GATE ELECTRODE

[75] Inventors: Yung J. Chen, Weston, Mass.; Rick K. Hodgman, Palos Verdes Peninsula, Calif.

[73] Assignee: McDonnell Douglas Corporation, Long Beach, Calif.

[21] Appl. No.: 489,461

[22] Filed: May 26, 1983

Related U.S. Application Data

[63] Continuation of Ser. No. 265,698, May 21, 1981.

[51] Int. Cl.$^3$ .................... H01L 29/78; H01L 29/34
[52] U.S. Cl. ....................................... 357/23; 357/52; 357/54; 357/91; 365/178; 365/184
[58] Field of Search ................... 357/23.5, 52, 54, 91; 365/178, 184

[56] References Cited

U.S. PATENT DOCUMENTS 4,330,850  5/1982  Jacobs et al. ................ 357/23 VT

*Primary Examiner*—Martin H. Edlow
*Assistant Examiner*—Jerome Jackson, Jr.
*Attorney, Agent, or Firm*—Gregory A. Cone; George W. Finch; Donald L. Royer

[57] ABSTRACT

High density, simplified fabrication and the elimination of sidewalk leakage effects are achieved by the implementation of a self-aligned ion-implantation step during the fabrication of the MNOS transistor wherein, after the formation of the gate electrode of the transistor, low energy ions are implanted within the nitride layer of the MNOS transistor in the regions of the nitride layer adjacent to the gate electrode.

6 Claims, 11 Drawing Figures

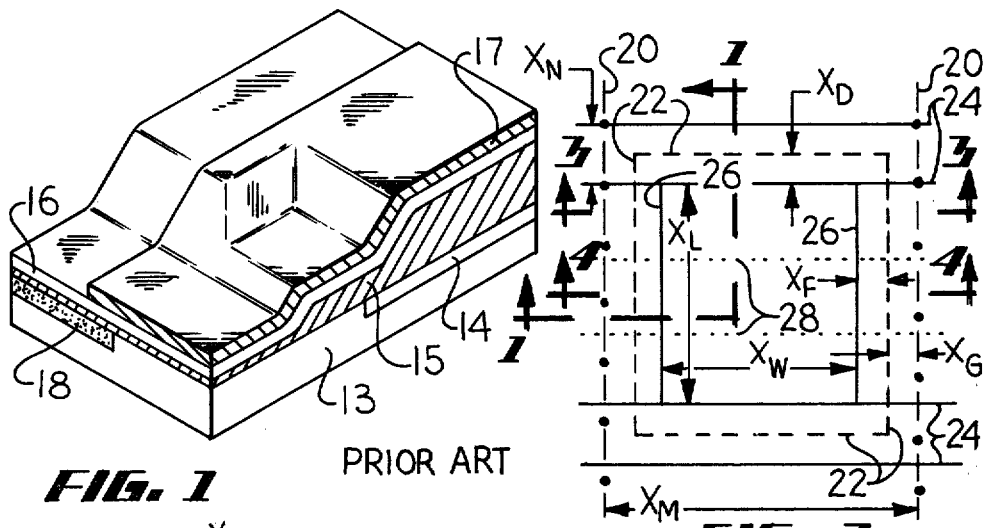
FIG. 1 PRIOR ART
FIG. 2
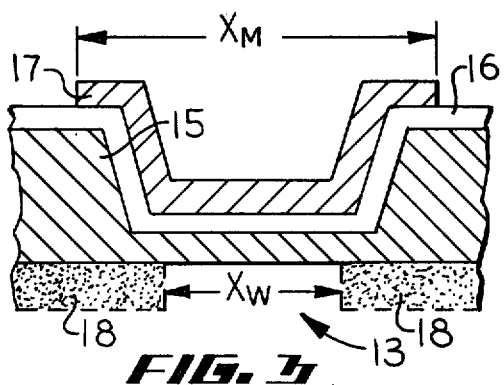
FIG. 3
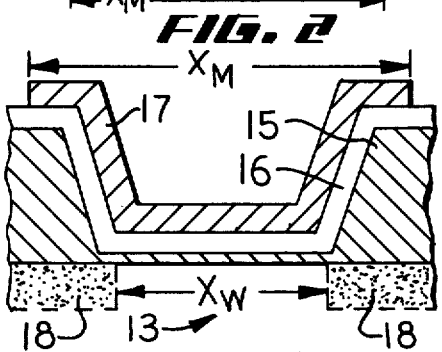
FIG. 4
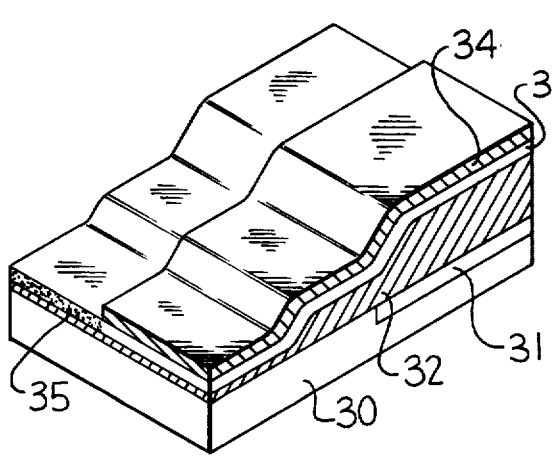
FIG. 5
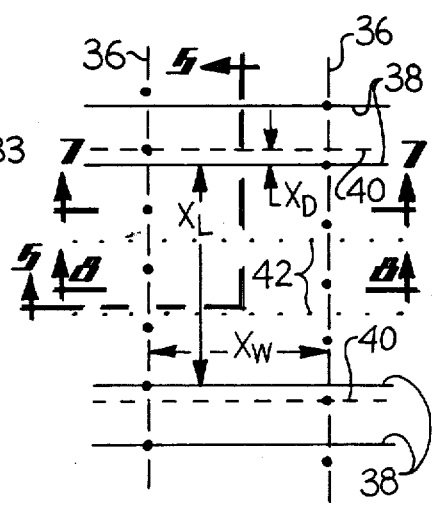
FIG. 6

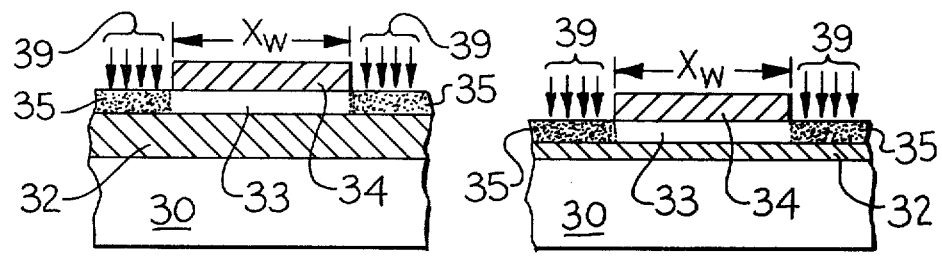
FIG. 7   FIG. 8
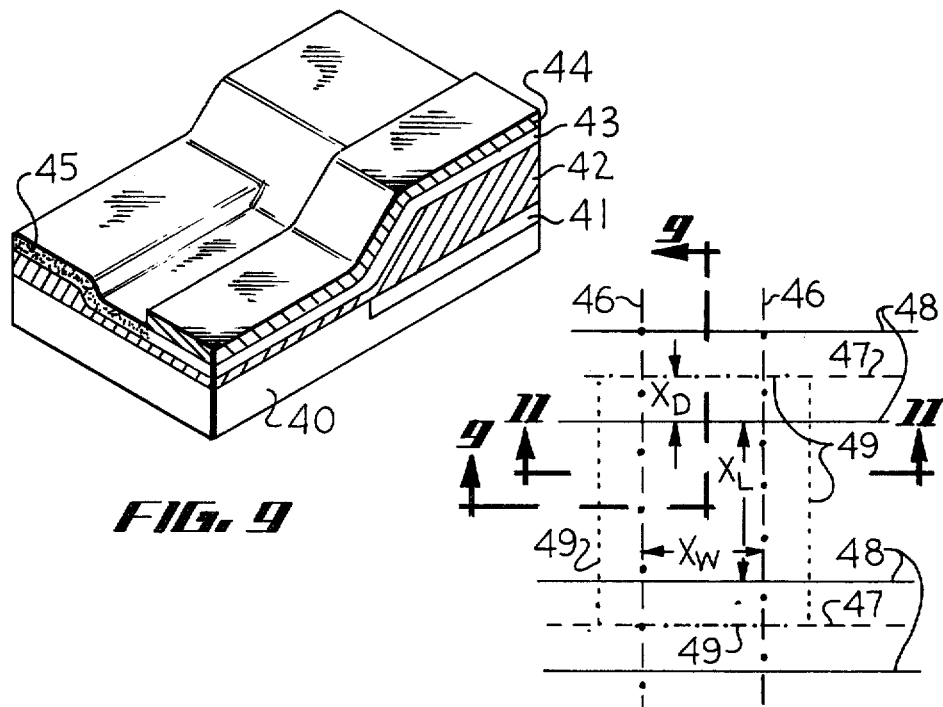
FIG. 9
FIG. 10
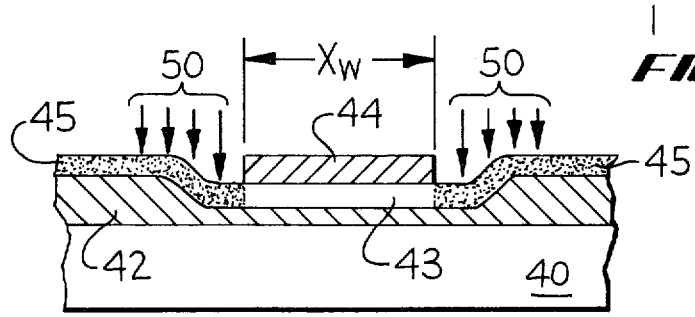
FIG. 11

HIGH DENSITY MNOS TRANSISTOR WITH ION IMPLANT INTO NITRIDE LAYER ADJACENT GATE ELECTRODE

This is a continuation of application Ser. No. 265,698, filed 21 May 1981.

BACKGROUND OF THE INVENTION

1. Field of the Invention

This invention relates to insulated gate field effect transistors (IGFET) and metal oxide semiconductor field effect transistors (MOSFET), in particular. Still more particularly, this invention relates to metal nitride oxide semiconductor (MNOS) transistors, most commonly employed as nonvolatile memory transistors.

2. Description of the Prior Art

Nonvolatile semiconductor memory transistor systems are known which typically employ large scale integration (LSI) or very large scale integration (VLSI) arrays of individual nonvolatile MOSFET elements with suitable interconnections to function as multi-bit storage devices. Each nonvolatile MOSFET element typically comprises a semiconductor substrate material of a first conductivity type, a pair of source and drain diffusion regions of opposite conductivity type from the substrate material and which are separated by an interstitial portion of the substrate material, an overlying dielectric oxide layer with minimum thickness in the region overlying the interstitial substrate portion, a layer of a different dielectric material over the oxide layer, and a gate electrode metallization or polysilicon layer overlying the dielectric material. In addition, an ohmic contact is provided for each diffusion region.

The nonvolatile MOSFET element above is most commonly implemented as the so-called MNOS transistor, which refers to the layers of the device in descending sequence, namely metal-nitride-oxide-semiconductor. The MNOS element can be operated as a two-state memory device by virtue of the variable threshold switching property exhibited by devices of this type. In a conventional field effect transistor, the threshold voltage which must be applied between the gate and the source electrodes to cause current conduction between the drain and the source electrodes is fixed. In MNOS devices, on the other hand, this threshold voltage can be altered by applying a relatively large potential difference across the gate dielectric. The threshold voltage may be altered back to a different level by applying a relatively large potential difference of opposite polarity across the gate dielectric. If the two different threshold voltages are well defined and of sufficiently different magnitude, an MNOS device may be operated as a bistable (binary) memory device by arbitrarily assigning one and zero values to the different threshold voltages, selectively altering the threshold voltage and subsequently interrogating the MNOS device with a voltage whose magnitude lies between the two different threshold voltages while sensing the source-to-drain current or voltage. The application of the relatively large potential difference across the gate dielectric causes charge carriers, either holes or electrons, to tunnel to the interface between the oxide layer and the nitride layer. The presence of these trapped charge carriers determines the threshold voltage level in the MNOS device.

The MNOS memory devices have been fabricated for use as bistable memory elements; and, while this MNOS implementation has many advantages, the performance of the early configurations of such devices was not found to be entirely satisfactory. One of the chief reasons for the unsatisfactory performance of these early variable threshold MNOS memory devices was the lack of predictability of the two different threshold voltages noted above. In the ideal case, the gate voltage-drain current characteristic of the device would consist of a pair of highly linear curves with very steep slopes and separated by a sufficient range of voltage in order that a range of gate voltages would exist which would cause the device to conduct heavily only if the device had been previously placed in the lower voltage threshold. The early devices did not approach the ideal case, however, and exhibited parasitic effects which result in gate voltage-drain current characteristics which varied between individual elements on a chip, and also varied from chip to chip in an unpredictable manner. These parasitic gate voltage-drain current characteristics were such that in either state the device could conduct heavily by applying the same interrogating gate voltage of a given magnitude. In other words, application of a given interrogation voltage to one of the early MNOS devices with this parasitic characteristic would not necessarily cause the device to conduct heavily in only the lower threshold state.

The apparent reason for this parasitic behavior of the early devices appeared to reside in the geometry required to produce an operable nonvolatile MNOS device. As noted above, such a device has an overlying oxide layer of minimum thickness in the region overlying an interstitial exposed portion of the substrate material which separates the two diffusion regions, with the oxide being covered by a layer of different dielectric material, which in turn is covered by a metallization layer in most usages. The field oxide layer elsewhere has a substantially uniform thickness many orders of magnitude greater than the minimum thickness beneath the gate electrode. Between the thick oxide region and the thin oxide region, there exists a transition region commonly termed a "sidewalk." This sidewalk region also functions as an MNOS device with gradually increasing oxide thickness. When the MNOS memory region, the thin oxide region, is switched between high and low threshold voltages, this transition region is switched to a threshold voltage somewhere between the high and low values of the main memory region. Thus, when the main channel is set at high threshold voltage, this transition region may be conducting at voltages lying below the high threshold voltage. Schematically the equivalent device would comprise a single MNOS memory element and two flanking MNOS devices with the source drain and gate elements coupled in parallel.

Many efforts have been made to solve this parasitic problem. Once such attempt has been to broaden the gate region in a direction perpendicular to the line separating the diffusion regions in order that the thin oxide gate region extends beyond the overlying gate electrode metallization layer. This solution introduces an additional problem due to the fringing electric field from the gate, termed the floating gate problem, in which charges tend to acumulate around the edge of the nitride insulation overlying the gate region with the result that the device rapidly degenerates into a different type of parasitic device exhibiting substantially the same parasitic behavior as noted above.

Another proposed solution has been the provision of a heavy ion-implantation region in the gate region which extends beyond the edges of the overlying gate electrode metallization layer in the direction noted above. These prior art ion-implantation techniques have exclusively dealt with relatively high energy ion-implantations which affect either the oxide layer or the underlying substrate. While this particular solution has been found to raise the threshold voltage of the regions adjacent the gate metallization layer beyond the high threshold voltage of the variable threshold MNOS device, the prior art implantation step is relatively difficult to perform in a controlled manner and inordinately lengthens the manufacturing process. An alternate variation of this solution has been the provision of a pair of independent blocking diffusion regions extending beyond opposite edges of the gate electrode metallization layer in the direction noted above and also partially into the gate region. This alternate solution, however, suffers from the same limitations as those noted above in that it requires additional processing steps, which increase the cost and the probability of error in manufacturing devices of this type.

Still another proposed solution has been to combat the sidewalk leakage by a variety of clever geometries involving different oxide thicknesses and varying overlaps thereof by the nitride and metallization layers. One such device is disclosed in U.S. Pat. No. 4,063,267 issued Dec. 13, 1977 to Yukun Hsia and assigned to the assignee of the present invention. While the more complex devices of this sort function properly when fabricated by the rather rigorous and complicated steps necessary for their implementation, this implementation has tended to be quite difficult. Additionally, with the increased complexity, additional space is required for each device. This is necessary because of invariant design rules. This is an obvious disadvantage given the larger considerations pointed towards increasingly smaller devices.

SUMMARY OF THE INVENTION

This invention comprises a method for fabricating an improved MNOS transistor and the transistor so produced.

The method proceeds by forming a semiconductor substrate of a first conductivity type material, forming a pair of laterally spaced diffusion regions of opposite conductivity type to the substrate material adjacent one surface of the substrate and forming an oxide layer having a portion of minimum thickness with a predetermined width at least partially overlying the interstitial portion of the substrate, forming a layer of silicon nitride dielectric material on the oxide layer after which an electrically conductive electrode is formed on the dielectric layer in the region overlying the minimum thickness portion of the oxide layer and implanting low energy ions of the first conductivity type into the silicon nitride dielectric material in the regions thereof adjacent to the electrically conductive electrode overlying the oxide layer. The MNOS device is completed by forming ohmic contacts with the diffusion regions.

The ion-implantation step is a relatively low energy process such that the ions do not penetrate the gate electrode and, in the regions adjacent the gate electrode, do not penetrate beyond the silicon nitride layer. The process is therefore self-aligned and does not require a separate mask operation. The presence of the implanted ions in the silicon nitride layer adjacent the gate electrode region effectively eliminates the sidewalk leakage problem.

The resulting MNOS transistor comprises: a semiconductor substrate of a first conductivity type; a pair of spaced semiconductive diffusion regions of a second conductivity type formed in the substrate, the diffusion regions being separated by an interstitial portion of said substrate and sharing a common boundary therewith; a layer of oxide material adhered to the common boundary surface; a layer of dielectric material adhered to said oxide layer; an electrically conductive (gate) electrode adhered to the dielectric layer overlying the interstitial substrate portion; the MNOS transistor being improved by the addition of implanted ions into the dielectric material in those portions thereof adjacent to, but not underlying, the gate electrode adhered thereto. The device may be implemented as either an N-channel or P-channel transistor. In one embodiment, the device is implemented as a full split gate transistor cell; in another embodiment the device is implemented as a half split gate transistor cell; and in yet another embodiment the device is implemented as a mono-gate transistor cell.

BRIEF DESCRIPTION OF THE DRAWINGS

FIG. 1 is a half section isometric view of a conventional prior MNOS transistor;

FIG. 2 is a plan view of the full transistor cell of FIG. 1;

FIG. 3 is a sectional view taken along lines 3—3 of FIG. 2;

FIG. 4 is a sectional view taken along lines 4—4 of FIG. 2;

FIG. 5 is a half section isometric view of the full split gate embodiment of this invention;

FIG. 6 is a plan view of the full transistor cell of the embodiment of FIG. 5;

FIG. 7 is a sectional view taken along lines 7—7 of FIG. 6;

FIG. 8 is a sectional view taken along lines 8—8 of FIG. 6;

FIG. 9 is a half section isometric view of the mono-gate embodiment of this invention;

FIG. 10 is a plan view of a full transistor cell of the embodiment of FIG. 9;

FIG. 11 is a sectional view taken along lines 11—11 of FIG. 10.

DETAILED DESCRIPTION OF THE INVENTION

FIGS. 1, 2, 3 and 4 portray in different views a typical prior art MNOS memory cell, specifically a full split gate N-channel MNOS transistor cell.

FIG. 1 is a half-section isometric view of this prior art MNOS transistor cell with a P-conductivity type substrate 13; an N-diffusion region 14 forming either the source or drain region for the transistor cell; an oxide layer 15; a dielectric layer 16, herein a layer of silicon nitride; a gate electrode layer 17, formed of either a metal or polysilicon; and the above-mentioned prior art ion-implantation region 18.

FIG. 2 is a plan view of the full prior art transistor cell. Section lines 1—1, 3—3, and 4—4 correspond to the respective views in FIGS. 1, 3 and 4. The width of the gate electrode is $x_M$ and is indicated by the two lines labeled 20. The lines labeled 22 indicate the boundary of the gate cut, which is a region of reduced thickness in the oxide layer. The lines labeled 24 indicate the boundaries for the two diffusion regions forming the source and drain electrodes of the transistor cell, the width of each being labeled $x_N$. The dimension $x_D$ indicates the gate length overlap with the N-plus diffusion region. The lines labeled 26 indicate the inner boundary for the ion implantation regions which flank, on either side, the channel region of the transistor cell. The lines labeled 28 indicate the memory cut which is the region of minimum thickness of the oxide layer in the transistor cell. The dimension $x_W$ indicates the width of the channel region of the transistor cell. The dimension $x_F$ indicates the gate spacing beyond the inner boundary of the field ion-implanted region. The dimension $x_G$ indicates the overlap of the metal layer beyond the gate region. The dimension $x_L$ indicates the channel length.

FIG. 3 is a sectional view taken along lines 3—3 of FIG. 2 portraying the so-called shoulder region of the MNOS transistor cell. Shown in this view are the substrate region 13, the oxide layer 15, the silicon nitride layer 16, the gate electrode layer 17, the field ion-implantation regions 18, the width of the electrode layer $x_M$, and the width of the channel of the device $x_W$. Of particular significance in this view are the differing thicknesses of the oxide layer 15 wherein the greater thickness on each side of the device indicate the field oxide region and the lesser thickness in the central portion of the device indicates the gate oxide region of the oxide layer. It should be realized that in this, as well as the other figures, the relative thicknesses of the various layers are not drawn to scale. Typical oxide layer thicknesses are about 2 nanometers for the memory oxide layer, about 100 nanometers for the gate oxide, and about 1.5 micrometers for the field oxide.

FIG. 4 is a sectional view taken along lines 4—4 from FIG. 2 portraying the so-called memory region of the MNOS transistor cell. This view shows the substrate 13, the oxide layer 15, the silicon nitride layer 16, the gate electrode layer 17, the field ion-implantation regions 18, the width of the channel region $x_W$, and the width of the gate electrode $x_M$. Of significance in this view is the uniform minimum thickness of the oxide layer 15 in this, the memory region of the transistor cell, the minimum thickness allowing for the charge carrier tunnelling to the interface between the oxide layer 15 and the silicon nitride layer 16 to provide for the memory characteristic of the device as discussed above.

This typical prior art MNOS transistor memory cell shown in the FIGS. 1, 2, 3 and 4 utilizes field ion-implantation to define the channel width of the MNOS device. The method by which this typical prior art cell is constructed requires that a number of separate alignment tolerances be built into each memory cell unit. This would account for about an eight micrometer extra width for each cell since there must be a one to two micrometer alignment tolerance for the field mask with respect to the gate mask and also for the metal mask with respect to the gate mask, accounting for four micrometers on each side. These alignment tolerances correspond to the dimensions $x_F$ and $x_G$ on each side of the channel width $x_W$. Although the channel itself will be of a width of about six micrometers, the space required for the overlying gate electrode is equal to the channel width $x_W$ plus two times the gate overlap with the metal $x_G$ plus 2 times the gate spacing from the field ion-implanted region $x_F$, producing a total gate electrode width, $x_M$, equal to $x_W$ plus two times $x_G$ plus two times $x_F$ or about fourteen micrometers. Remembering that the gate electrode width can approach the channel width as a minimum dimension, it is clear that there is substantial excess width for the gate electrode in this typical prior art MNOS transistor cell.

FIG. 5 is a half-section isometric view of the full split gate MNOS transistor cell embodiment of this invention. Shown in this view are the P-type substrate 30, the oxide layer 32, the N+ diffusion region 31 forming either the source or drain electrode for the device, the silicon nitride layer 33, the gate electrode layer 34, and the ion-implanted region 35 within the silicon nitride layer 33. A comparison with the prior art device illustrated in FIG. 1 shows that the field ion-implantation region 18 of the prior art device is not present in the device of FIG. 5 and that a new ion-implantation region 35, not found in the prior art device of FIG. 1, is present in the device of this invention.

FIG. 6 is a plan view of the full transistor cell of the embodiment of FIG. 5. Section lines 5—5, 7—7, and 8—8 correspond to the views shown in FIGS. 5, 7, and 8 respectively of this embodiment of the invention. This embodiment is specifically a full split gate configuration. In FIG. 6, lines 36 indicate the width, $x_W$ of the gate electrode layer. Lines 38 indicate the width of the diffusion regions forming the source and drain electrodes at either end of the transistor. The lines labeled 40 indicate the width of the gate cut, and the dimension $x_D$ indicates the overlap of the gate region over the diffusion region at each end of the device. The dimension $x_L$ indicates the length of the channel region. The lines labeled 42 indicate the boundaries of the memory cut.

FIG. 7 is a sectional view taken along lines 7—7 of FIG. 6 and shows the shoulder region of the device. This view indicates the substrate 30, the oxide layer 32, the silicon nitride layer 33, the gate electrode 34, the ion-implanted regions of the silicon nitride layer 35 adjacent the gate electrode and the arrows 39 indicate the low energy ion-implantation process which is blocked by the gate electrode 34 from penetrating the silicon nitride layer in the region immediately beneath the gate electrode. The dimension $x_W$ is both the width of the channel region and the width of the gate electrode.

FIG. 8 is a sectional view taken along lines 8—8 of FIG. 6 and shows the memory region of the device. Shown in this view are the substrate 30, the oxide layer 32, the silicon nitride layer 33, the gate electrode layer 34, the ion-implanted regions of the silicon nitride layer 35, and the dimension indicating the width of the channel region and the gate electrode $x_W$. Again, the arrows 39 indicate the low energy ion-implantation process which is blocked by the gate electrode and does not penetrate the silicon nitride layer immediately beneath the gate electrode. It is significant to note once again the difference in the thickness of the oxide layer 32 between this, the memory region, and the shoulder region oxide layer illustrated in FIG. 7.

FIG. 9 is a half section isometric view of the mono gate embodiment of this invention. For many applications, the mono gate configuration will be desirable due to the high densities possible. Shown in this view are the substrate 40, the diffusion region 41, the oxide layer 42, the silicon nitride layer 43, the gate electrode layer 44, and the ion-implanted region of the silicon nitride layer 45.

FIG. 10 is a plan view of the full transistor cell of the embodiment shown in FIG. 9. Sectional lines 9—9 and 11—11 correspond to the views shown in FIGS. 9 and 11 respectively. In FIG. 10 the lines labeled 46 indicate the width of the gate electrode. The lines 48 indicate the boundaries for the two diffusion regions forming the source and drain electrodes of the transistor cells. The lines 49 indicate the perimeter of the memory cut, and the lines 47 indicate the gate cut. The dimension $x_D$ indicates the overlap of the gate region over the diffusion region, the dimension $x_L$ indicates the length of the channel, and the dimension $x_W$ indicates the width of both the gate electrode and the channel.

FIG. 11 is a sectional view taken along lines 11—11 of FIG. 10 and shows the memory region of the device. In this view are shown the substrate 40, the oxide layer 42, the silicon nitride layer 43, the gate electrode layer 44, and the ion-implanted region 45 of the silicon nitride layer. Also shown are the arrows 50 indicating the low energy ion-implant process which does not penetrate the gate electrode 44 or the underlying region of the silicon nitride layer. The dimension $x_W$ indicates the width of both the channel region and the gate electrode.

As mentioned above, FIGS. 5, 6, 7, and 8 illustrate the full split gate embodiment of this invention while FIGS. 9, 10, and 11 illustrate the mono gate embodiment of this invention. A half split gate embodiment is also possible with this invention, and its implementation is well within the expertise of one with ordinary skill in the art. In any case, the basic concepts of our invention remain the same regardless of the specific implementation contemplated. By utilizing a low energy ion-implantation process which is self-aligned with respect to the gate electrode and which affects only the silicon nitride layer adjacent the gate electrode, it is possible to fabricate an improved MNOS memory transistor cell which has a number of significant advantages over the prior art. The self-aligned nature of our process produces a unit cell area which is significantly smaller than that of the prior art and which eliminates the now unneeded alignment tolerance spacings which account for the eight micrometer extra width of the gate electrode of the prior art device discussed above. Our invention eliminates the field oxide region found in the prior art device and thus circumvents the significant slope etching problem encountered in etching the steep slopes of the edges of the gate region of the prior art device. By utilizing the self-aligned anti-sidewalk ion-implantation into the silicon nitride layer, the sidewalk leakage problems of the prior art devices are eliminated. The fabrication of this device requires no extra masking steps. In fact, the process is easier to carry out than most existing MNOS fabrication processes because of the inherent simplicity of the disclosed MNOS transistor cell. The cell configuration, although it is described herein in terms of an N-channel process, is also applicable to P-channel processes. Although most usages will contemplate a metal gate electrode process, these same cell structures are also possible using a polysilicon gate electrode layer. Additionally, since the anti-sidewalk leakage ion-implantation step is a low voltage and low dosage implant into the nitride layer instead of a high energy and high dosage implant into the substrate or silicon layer, a simplified device geometry can be utilized with the advantage of smaller and simpler device size. This inherent simplicity lends itself to further reductions in size and a relatively larger usable memory window region. Also because of the low implant energy and dosage used in our process, there is less chance of damage to the dielectric layer resulting in a more reliable process. Also, the low energy low dosage process does not increase the dopant concentration in the silicon substrate appreciably and therefore does not affect the source-drain breakdown voltage.

The disclosed MNOS transistor cells are normally integrated into circuits comprising both MNOS and other MOSFET transistors in various circuits on a silicon chip. The following is a brief summary of the steps necessary to implement our invention within such a larger scale process:

1. a moat isolation step if needed;
2. a P+ diffusion step for a substrate contact;
3. an N+ diffusion step for the source-drain diffusion regions;
4. a field ion-implantation step for peripheral circuits;
5. a field oxidation step;
6. a gate cut-gate oxidation step for MOSFET devices;
7. an enhancement-depletion ion-implantation for MOSFET devices;
8. a memory cut step for the MNOS memory region and contact cut for ohmic contacts;
9. a memory oxidation-nitride deposition step for the MNOS devices;
10. a nitride etch step to remove excess silicon nitride from the chip;
11. a metal deposition and etch step to emplace the gate electrodes; and
12. the anti-sidewalk implantation step for the MNOS memory cells.

For the case of N-channel processes the anti-sidewalk ion-implantation is a boron implant at about 20,000 electron volts for a nitride layer of approximately 500 angstroms thickness. For the case of a P-channel process, the ion-implantation would normally be a nitrogen implantation of similar energy. The implantation energy is chosen such that it does not cause the ions to penetrate the gate electrode layer which is normally about 5,000 angstroms in thickness or beyond the nitride layer. This is, therefore, a self-aligned implant process which does not require any additional masking steps and does not cost any device area for alignment tolerance. However, if required by a special implementation, one could use a special mask to perform the ion-implantation step. The boron ion-implantation creates damage in the nitride layer which results in an appreciable amount of negative charges in the nitride layer, thus shifting the inversion threshold higher. For P-channel processes, a nitrogen ion-implantation creates positive charges in the nitride and thus also increases in magnitude the inversion threshold for those devices.

This invention can be utilized for any circuit chip which utilizes the metal nitride oxide silicon memory transistor. As mentioned above, it provides for significant advantages in reduced size, ease of fabrication, and reliability when compared with prior art devices of the same type.

We claim:

1. In a metal nitride oxide semiconductor (MNOS) dual threshold memory transistor comprising:
   a semiconductor substrate comprising silicon of a first conductivity type;
   a pair of spaced source and drain diffusion regions of a second conductivity type formed in the substrate, the diffusion regions being separated by an interstitial portion of said substrate and sharing a common boundary therewith;
   a layer of oxide material adhered to the common boundary surface said oxide layer comprising a silicon dioxide layer having a central memory region having a thickness of less than about 4 nanometers located atop the interstitial portion and surrounding oxide regions of substantially greater thickness;

a layer of silicon nitride material adhered to said oxide layer;

an electrically conductive gate electrode adhered to the silicon nitride layer overlying the central memory region of the oxide layer;

the improvement comprising the addition of ion implanted ions of the first conductivity type into and no deeper than the silicon nitride layer in those portions thereof adjacent to the gate electrode such that the implantation of the ions into those regions of the silicon nitride layer beneath the gate electrode is effectively blocked by the gate electrode.

2. The memory transistor of claim 1 realized in a full split gate configuration.

3. The memory transistor of claim 1 realized in a half split gate configuration.

4. The memory transistor of claim 1 realized in a mono gate configuration.

5. The memory transistor of claim 1 wherein the second conductivity type is N-conductivity and the implanted ions are boron ions.

6. The memory transistor of claim 1 wherein the second conductivity type is P-conductivity and the implanted ions are nitrogen ions.

* * * * *